United States Patent [19]

Hunsperger et al.

[11] 3,912,546

[45] Oct. 14, 1975

[54] ENHANCEMENT MODE, SCHOTTKY-BARRIER GATE GALLIUM ARSENIDE FIELD EFFECT TRANSISTOR

[75] Inventors: Robert G. Hunsperger, Malibu; Nathan Hirsch, Santa Monica, both of Calif.

[73] Assignee: Hughes Aircraft Company, Culver City, Calif.

[22] Filed: Dec. 6, 1974

[21] Appl. No.: 530,117

[52] U.S. Cl. ...................... 148/1.5; 29/578; 357/91
[51] Int. Cl.² ........................................ H01L 21/263
[58] Field of Search ........... 148/1.5; 29/578; 357/91

[56] References Cited

UNITED STATES PATENTS

| | | | |
|---|---|---|---|
| 3,590,471 | 7/1971 | Lepselter et al. | 148/1.5 X |
| 3,649,369 | 3/1972 | Hunsperger et al. | 148/1.5 |
| 3,650,019 | 3/1972 | Robinson | 148/1.5 X |
| 3,747,203 | 7/1973 | Shannon | 148/1.5 X |
| 3,756,862 | 9/1973 | Ahn et al. | 148/1.5 |

*Primary Examiner*—L. Dewayne Rutledge
*Assistant Examiner*—J. M. Davis
*Attorney, Agent, or Firm*—William J. Bethurum; W. H. MacAllister

[57] ABSTRACT

Disclosed is a new process for fabricating field effect transistors, and particularly enhancement mode and depletion mode Schottky-gate field effect transistors. The process includes the steps of forming a thin layer of gate metalization over the FET channel region, and this gate metalization is then exposed to the bombardment of protons with sufficiently high energy to penetrate through the gate metalization layer and enter the channel region of the FET and there produce deep level energy traps in the channel region. These traps serve to tie up carriers and create donor and acceptor vacancy complexes in the FET channel. This step has the effect of raising the resistivity of the FET channel and is used to make the FET device non-conducting with zero voltage on the gate metalization, i.e., an enhancement mode device.

12 Claims, 19 Drawing Figures

ENHANCEMENT MODE, SCHOTTKY-BARRIER GATE GALLIUM ARSENIDE FIELD EFFECT TRANSISTOR

FIELD OF THE INVENTION

Figure 1A:
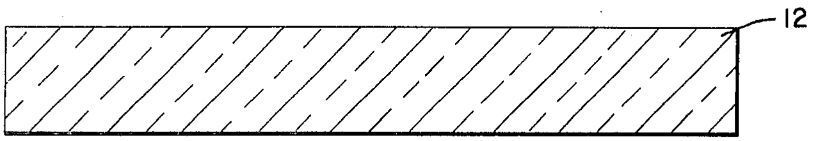

This invention relates generally to a new class of proton implanted field effect transistors, such as Schottky-gate field effect transistors, PN junction field effect transistors and MOS field effect transistors. The FET channel conductivity of these devices is established and controlled by proton bombardment. More particularly, this invention is directed to a process for fabricating enhancement mode and depletion mode field effect devices, side by side on a common semiconductor chip, with a minimum of process complexity and a maximum of control over the ultimate carrier concentration in the FET channel.

In one preferred embodiment, the invention is specifically directed to a new and improved Schottky-gate enhancement mode gallium arsenide field effect transistor and process for making same. This GaAs transistor is very useful as a wide band high frequency microwave amplifier and as a switching device in high speed computer circuits.

BACKGROUND

Both the enhancement mode and the depletion mode of FET device operation is generally well known in many types of field effect transistors, such as Schottky-gate FETs, PN junction FETS, MOSFETS, and possibly others. According to the generally accepted definition of enhancement mode FET operation, the FET channel region of the device is completely depleted of carriers for zero voltage on the gate, i.e., $V_{GS} = 0$, and with a given source-to-drain voltage, $V_{DS}$, applied to the device. In order to produce conduction in the FET device, some predetermined value of $V_{GS}$ must be applied to the gate to attract charge carriers in the channel region in quantities sufficient to produce conduction in the FET channel between source and drain regions of the device.

According to the generally accepted definition of the depletion mode of FET device operation, the device is conducting at $V_{GS} = 0$ for a given $V_{DS}$, and in order to turn the device off, a predetermined $V_{GS}$ must be applied to the gate electrode of the device to deplete the channel region of carriers and thus to terminate conduction in the FET channel. Therefore, it is obvious from the above that there are different processing considerations involved in the fabrication of enhancement mode FETs and in the fabrication of depletion mode FETS. These processing considerations may become particularly critical where these two different types of devices are fabricated side by side in a single semiconductor wafer. Among other processing considerations, the depletion mode devices must have higher dopant atom concentrations in their channel regions than the enhancement mode FET devices.

PRIOR ART

Many different processes have been used to control carrier concentrations in the FET channel regions of many kinds of FETs. For example, enhancement and depletion mode FETs of both the MOS and junction variety have been fabricated using multiple epitaxial steps to form both the channel regions and source and drain regions of these devices. Additionally, a combination of epitaxial and diffusion processes have been used to form these device regions and to control the carrier concentration levels in the FET channel in accordance with the particular doping levels used in the epitaxial and diffusion processes. Still other prior art FET processes have used gate alloying techniques in order to control carrier concentration in the FET channel, and the latter technique is taught specifically by Shinoda et al., U.S. Pat. No. 3,767,984, in the fabrication of side-by-side enhancement mode and depletion mode GaAs devices fabricated in a common semiconductor substrate.

But in all of the above processes known to us, and particularly in the Shinoda et al. process there is the inherent process disadvantage of the inability to completely isolate certain closely spaced devices on a semiconductor substrate from certain steps of the process which are required by other devices. For example, Shinoda et al. uses an alloy process to drive the gate electrodes of an enhancement mode device further into the GaAs substrate than the corresponding gate electrode of an adjacent depletion mode device. However, this alloying process requires heating the enhancement mode FET gate to an elevated temperature, and it is difficult to isolate the adjacent depletion mode FET gate from this process step. In addition to the latter disadvantage of the Shinoda et al. process, it is difficult to precisely control the FET channel thickness where gate alloying techniques are used to drive the gate metallization into a semiconductor layer and thereby control FET channel carrier concentration.

In related FET processes which use epitaxial deposition to form the FET channel and solid state diffusion to form the gate, source and drain regions, one would normally dope an enhancement mode device with fewer impurities than are required to dope a depletion mode device fabricated side by side on a single chip. However, it is difficult if not impossible to temperature isolate the particular FET device not being treated from the FET device being treated, in order to carefully establish different levels of carrier concentration in the different FET channel regions.

THE INVENTION

The general purpose of this invention is to provide a novel field effect transistor fabrication process which overcomes the above prior art disadvantages of temperature exposure and lack of control over FET channel thickness and carrier concentration, which disadvantages are associated with the above prior art epitaxial-alloying and epitaxial-diffusion processes. Our process may be used in the fabrication of both silicon and gallium arsenide field effect transistors in a wide variety of device types.

To attain this purpose, we utilize a novel proton bombardment process wherein a very thin layer of gate metalization is formed atop the FET channel region, and this layer is used utimately as the gate electrode of the device. This thin gate metalization layer is bombarded with high energy protons which penetrate through the gate metalization layer and enter the FET channel region, thereby raising the resistivity of the FET channel region in accordance with the particular proton dosage used. This proton bombardment step serves to create deep level traps in the band gap of the particular semiconductive material used, thereby tying up carriers in the channel available for conduction, and raising the resistivity of the channel. In the fabrication of an enhancement mode device, this processing has the effect of causing the depletion of all available carriers in the FET channel region at a zero gate voltage, $V_{GS}=0$, and for a given FET source to drain voltage $V_{DS}$. An adjacent depletion mode FET on the same chip may be completely isolated from this proton bombardment process merely by masking the adjacent device from the protons. Additionally, the depletion mode device does not have to be subjected to any elevated temperatures, since the proton bombardment step can be carried out at room temperature.

In the fabrication of Schottky-gate FETs, the thin layer of gate metalization may be deposited directly on the FET channel surface in order to form the Schottky barrier rectifiying contact thereon. On the other hand, this process may also be used in controlling channel conduction in MOS devices, in which case a thin layer of surface oxide can be grown or deposited atop the channel region before the gate metallization is deposited atop this oxide coating. Then protons can be projected through both the gate metallization and the $SiO_2$ and into the FET channel region.

Accordingly, it is an object of the present invention to provide a new class of field effect transistors wherein the carrier concentration in the FET channel region is controlled by proton bombardment.

Another object is to provide a novel low temperature proton bombardment process for fabricating enhancement mode field effect transistors.

Another object is to provide a device fabrication process of the type described particularly adaptable for the fabrication of enhancement mode and depeletion mode field effect devices on a single semiconductor chip.

A feature of the present invention is the provision of a field effect device wherein a defect compensated channel region is perfectly aligned between source and drain regions of the device.

Another feature is the provision of a proton bombardment process of the type described wherein the precise control of FET channel resistivity is achieved in accordance with the precise control of proton dosage used in creating defect compensated donor and acceptor vacancy complexes in the FET channel region.

Another feature is the provision of a process of the type described which may be used in fabricating both metal-to-semiconductor contact devices, such as Schottky gate field effect devices and PN junction FETs, as well as metal-oxide-semiconductor (MOS) type devices.

These and other objects and features of the invention will become more fully apparent in the following description of the accompanying drawing.

DRAWINGS

FIGS. *1a* through *1m* illustrate, in series of schematic cross section views, a sequence of process steps utilized in fabricating a Schottky gate FET in accordance with the present invention.

FIG. *1n* is a perspective view of FIG. *1m*.

FIGS. *2a* through *2d* illustrate, in schematic cross section views, a series of process steps which may be utilized in fabricating an MOS type device in accordance with the present invention.

Figure 3:
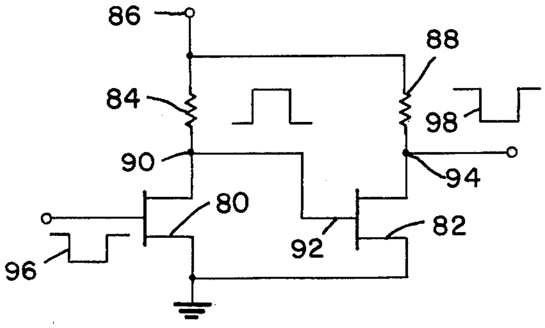

FIG. 3 illustrates, in a circuit schematic diagram, a typical useful high speed non-inverting digital logic circuit which employs one enhancement mode FET and one depletion mode FET, and which may be fabricated as a monolithic integrated circuit.

THE GaAs ENHANCEMENT MODE SCHOTTKY GATE DEVICE

Referring now to FIG. 1, there is illustrated a process whereby a novel Schottky-barrier-gate enhancement mode field effect transistor is fabricated. For the particular GaAs FET device which has been successfully reduced to practice, the GaAs chromium-doped substrate 12 had a bulk resistivity of $10^8$ ohm centimeters, a chromium concentration of at least $10^{16}$ atoms/ cc and it was approximately 18 mils in thickness. The GaAs substrate 12 in FIG. 1*a* was initially placed in a Teflon etch basket and soaked in hydroflouric acid, HF, from between 3 and 5 minutes. Next the substrate 12 was rinsed in deionized water for approximately 5 minutes, whereafter it was removed to a hot acetone rinse and there left for approximately 15 seconds. This hot acetone rinse was maintained betwen 50° and 55°C. Next, the wafer 12 was placed in a hot solvent mixture of one-third trichloroethylene, one-third acetone, and one-third methanol for approximately 15 seconds. This latter rinse was maintained from between 50° and 55°C.

Then the substrate 12 was again rinsed in hot 55°C acetone for approximately 15 seconds, whereafter it was transferred to a hot isopropyl alcohol bath at between 65° and 70°C where it was again rinsed. The wafer 12 was then scrubbed with a soft swab which had previously been immersed in isopropyl alcohol. Next, the wafer 12 was again rinsed in hot isopropyl alcohol at 70°C for approximately 1 minute, whereafter it was blown dry with filtered dry nitrogen and then allowed to bake in a furnace at approximately 140°C for a minimum of 1 hour.

Next, the above cleansed and chemically polished GaAs wafer 12 was placed in an ion implantation chamber maintained at room temperature and initially implanted at 20 KeV with $2 \times 10^{12}$ sulphur atoms/cm$^2$ and then subsequently implanted at 100 KeV with $6 \times 10^{12}$ sulphur atoms/cm$^2$. This double implantation process was utilized to produce a thin substantially uniform sulphur implanted layer 14 as shown in FIG. 1*b*, having a thickness on the order of 0.2 micrometers and a carrier concentration of approximately $10^{17}$/cm$^3$ for a doping efficiency of 25%.

Figure 1B:
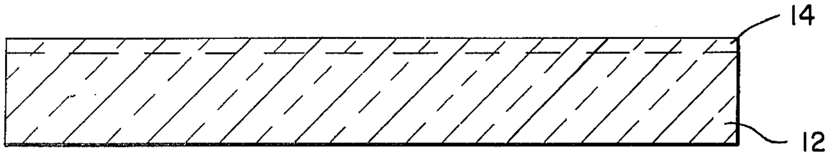

The wafer in FIG. 1*b* was then transferred to a SILOX oxide deposition system wherein a layer 16 of $SiO_2$ was deposited as shown on the upper surface of the structure, and this layer 16 prevents disassociation of the GaAs and out-diffusion of the sulphur ions during a subsequent anneal step. The structure in FIG. 1*c* was then transferred to an anneal furnice wherein it was annealed at a temperature of approximately 800°C in a flowing forming gas atmosphere 90%$N_2$ : 110%$H_2$) for approximately 20 minutes. This process activated the implanted sulphur atoms in layer 14 and annealed out the implantation-caused lattice defects that would otherwise have excessively reduced carrier mobilities in the implanted layer 14.

Figure 1C:
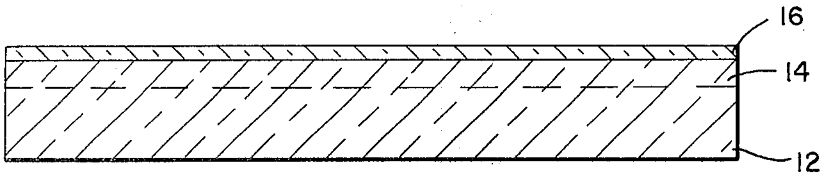
Figure 1D:
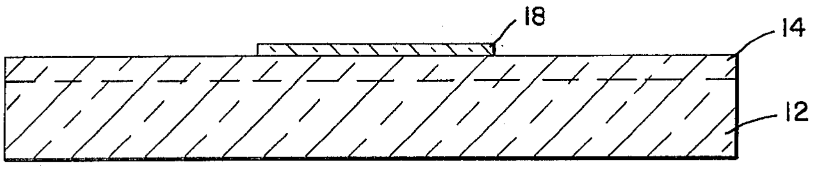
Figure 1E:
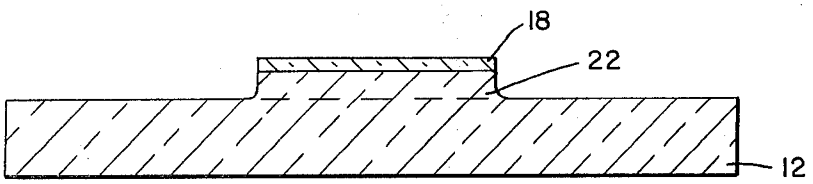
Figure 1F:
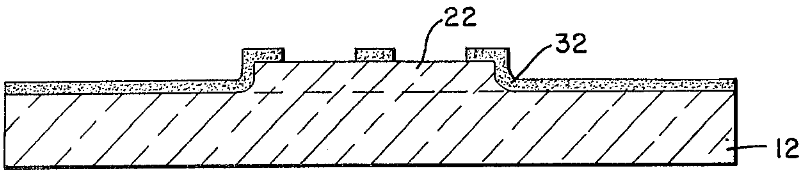

The wafer in FIG. 1*c* was then transferred to a conventional photoresist processing station where the $SiO_2$ layer 16 was removed from the wafer surface using HF and thereafter a photoresist mask 18 was formed on the upper surface of the GaAs wafer. Next, the wafer in FIG. 1*d* was subjected to a suitable GaAs etchant, such as a mixture of $N_aOH$ and $H_2O_2$, and this etchant removed the surrounding outer portion of the implanted layer 14, thereby leaving the rectangular mesa-like island region 22 as shown in FIG. 1*e*. In the GaAs wafers actually processed, these mesas 90 were approximately 300 micrometers wide and 0.5 micrometers high. Next, the photoresist mask 18 was removed from the mesa-etched structure in FIG. 1*e*, and thereafter a new photoresist masking pattern 32 was formed on the structure as shown in FIG. 1*f*.

Figure 1G:
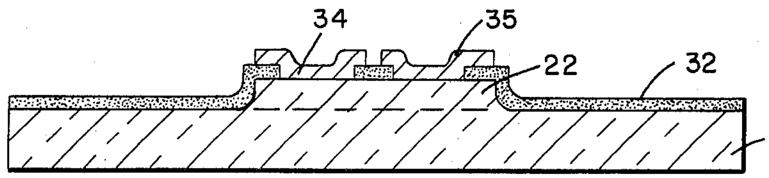
Figure 1H:
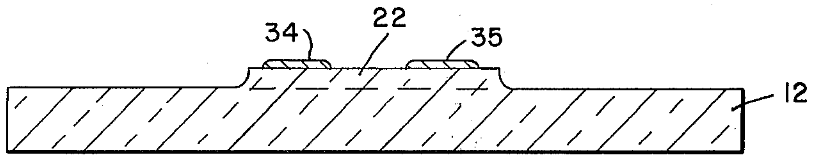
Figure 1I:
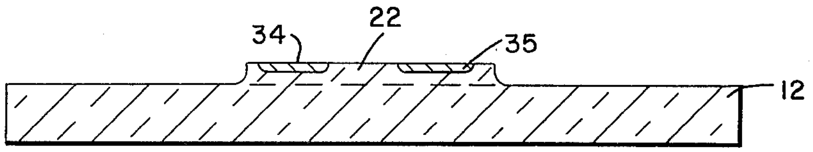

When the new photoresist mask 32 had dried sufficiently, a pair of ohmic contact metalization pads 34 and 35 of a gold-germanium and nickle coated alloy were deposited in the mask openings and on the upper surface of the structure shown in FIG. 1*g*. After the pads 34 and 35 were suitably adherent to the upper surface of the GaAs wafer, the photo-resist pattern 32 was dissolved away from the upper surface of the wafer using a solvent soak. The latter step left the gold-germanium source and drain contacts 34 and 35 intact as shown in FIG. 1*h*. The structure in FIG. 1*h* was then heated at approximately 400°C for approximately 1 minute in a flowing 90%$N_2$ : 10%$H_2$ atmosphere in order to alloy the source and drain contacts into the surface of the N-type mesa island as shown in FIG. 1*i*. These gold-germanium contacts 34 and 35 form an alloy bond with the mesa island 22, and actually become partially submerged below the surface of the N-type island 22 after the above heat-treating process.

Figure 1J:
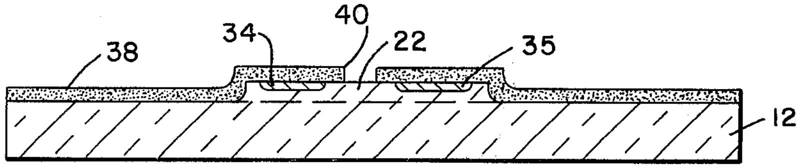
Figure 1K:
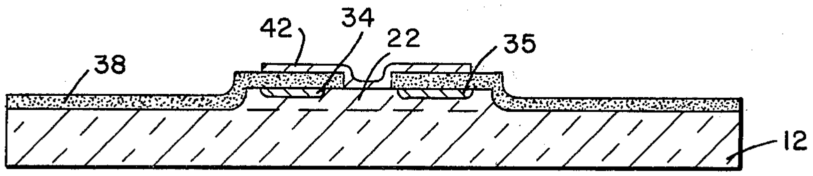

The wafer shown in FIG. 1*i* was then transferred to a standard photoresist processing station where another photoresist mask 38 shown in FIG. 1*j* was deposited on the wafer surface. The mask 38 has a central opening 40 therein for receiving a very thin strip of aluminum gate metallization 42 which was vapor deposited on the surface of the structure shown in FIG. 1*j* using standard aluminum evaporation techniques, which are well-known in the art. This strip 42 was approximately 1100 angstroms in thickness. After the thin aluminum strip 42 was suitably adherent to the N-type ion implanted channel region 22, the structure in FIG. 1(k) was transferred to a soak-solvent such as acetone, which dissolved away the photoresist mask 38, carrying with it the overlying portions of the aluminum metalization strip 42. This step left intact the very narrow and thin aluminum gate electrode 44 which was centered as shown between the source and drain contacts 34 and 35 in FIG. 1*l*.

This aluminum gate electrode 44 was, as mentioned, approximately 1100 Angstroms thick and had a gate length of approximately 3.0 micrometers. Although the gate electrode 44 was centered between source and drain contacts 34 and 35, it does not have to be centered for all device applications, and may instead be offset with respect to the source electrode in order to reduce the series resistance in the input signal path of the device.

Figure 1L:
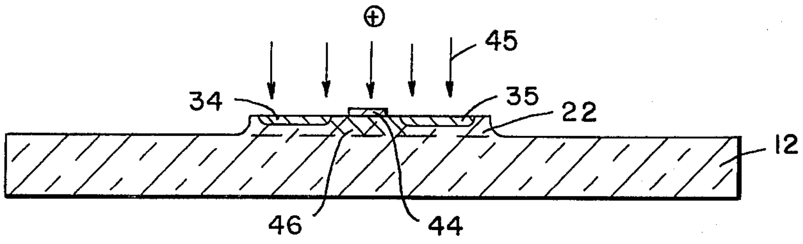

The structure in FIG. 1*l* was then transferred to a proton bombardment chamber (not shown) wherein a dose 45 of approximately $5.5 \times 10^{12}$ protons per square centimeter was projected into the channel region using an acceleration voltage of 150 KeV. This proton bombardment step produced the bombarded region 46 as shown in FIG. 1*l* within the previously defined channel region 22. This region 46 is characterized by compensating defect centers which reduce the carrier concentration in the FET channel to the extent that is pinched off with zero bias voltage on the gate. The latter is due to the combination of the built-in potential of the Schottky barrier junction of the device and its associated depletion region for $V_{GS} = 0$. This proton dosage created an enhancement mode field effect transistor with an on-state saturated drain current, $I_{DS}$, of 180 microamperes for a gate voltage of +0.6 volts, and with an off-state drain current, $I_{DS}$, of 20 microamperes for a gate-source voltage, $V_{GS}$, of zero. This on/off current ratio can be improved by optimization of the proton dosage.

The source to drain spacing for the device shown in FIG. 1*l* was 9 micrometers, and the vertical channel thickness (from surface of 22 to the interface of 22 and 12) was approximately 0.3 micrometers. The channel region 22 of the device had an initial carrier concentration prior to proton bombardment of approximately $10^{17}$ carriers per cubic centimeter, whereas the carrier concentration after proton bombardment was approximately $10^{15}$ carriers per cubic centimeter; i.e., $N(x) = 10^{15}/cm^3$. It should be observed that the proton bombardment region 46 did not penetrate the source and drain contacts 34 and 35, which are normally somewhat thicker than the gate contact 44. The proton bombarded region 46 is perfectly aligned with the inner edges of the source and drain contacts 34 and 35 while extending continuously beneath the thin gate electrode 44 from the source to drain regions of the device.

Figure 1M:
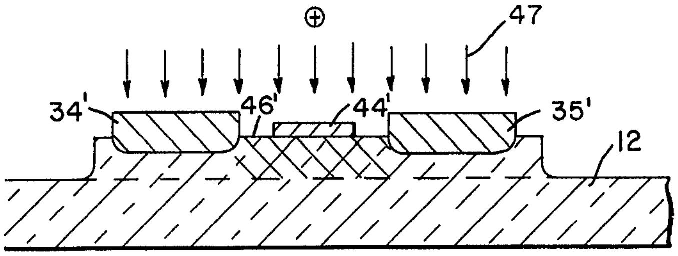

The processing steps described above in FIGS. 1*g*, 1*h* and 1*i* may be modified so that the gold-germanium contacts 34 and 35 are made even thicker than shown in these figures in order to provide the resultant device structure shown in FIG. 1*m*. This structure has the thicker gold-germanium contacts 34' and 35' which would, of course, permit the use of higher proton dosages and acceleration voltages without proton penetration through these contacts and into the source and drain regions. However, since these gold-germanium contacts 34,34' and 35,35' are composed of atoms normally five times heavier than the aluminum atom in the gate electrode 44, then for certain dosages and acceleration voltages (for example, those described above, it is not necessary that the gold-germanium source and drain contacts be any thicker than the aluminum gate contact through which the protons pass.

Figure 1N:
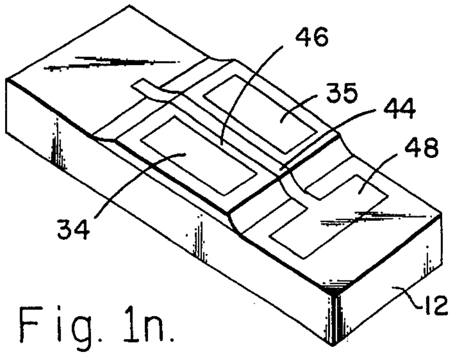

The 3-dimensional view in FIG. 1*n* illustrates the overall device geometry of our enhancement mode, FET and particularly the gate contact pad 48 to which gate voltage connections may advantageously be made.

THE SILICON MOS ENHANCEMENT MODE DEVICE

Figure 2A:
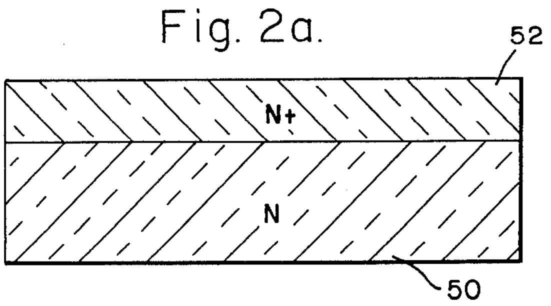
Figure 2B:
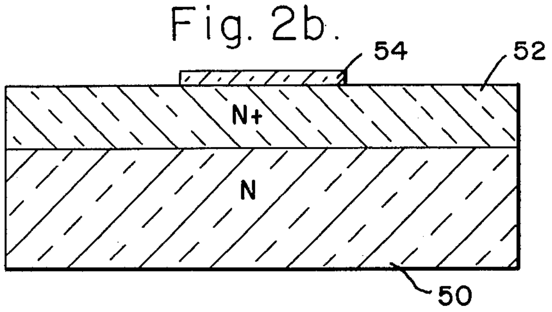
Figure 2:
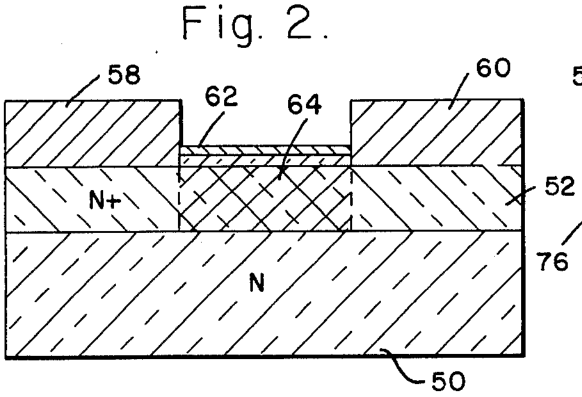

Referring now to an alternative embodiment of our invention shown in FIG. 2, there is shown in FIG. 2*a* an N type silicon substrate 50 upon which a thin N+ epitaxial layer 52 is deposited on the order of approximately 0.5 microns in thickness and with a carrier concentration of approximately $10^{18}$ carriers per cubic centimeter. The epitaxial structure in FIG. 2*a* is then transferred to a standard photolithographic station wherein a thin oxide layer (not shown) of $SiO_2$ is grown and photolithographically processed with standard photoresist techniques to form the $SiO_2$ island 54. This thin $SiO_2$ island 44 is typically between a 1000 and 1200 Angstroms in thickness.

The structure in FIG. 2*b* is then transferred to a first metal (gold) deposition station where relatively thick gold source and drain contacts 58 and 60 are deposited on the exposed surface areas of the epitaxial layer 52 peripheral to the $SiO_2$ island 54, and these ohmic contacts are typically between 3000 and 5000 Angstroms in thickness. If necessary, conventional annealing procedures may be employed to insure that good ohmic connection is made between the gold contacts 58 and 60 and the underlying $N^+$ epitaial lyer 52. Then, the latter structre is transferred to a second, aluminum deposition station where a very thin layer 62 of Al is deposited on the top surface of the $SiO_2$ islads 54,as shown in FIG. 2*c*.

This layer 62 forms the MOS gate electrode and is typically about 1100 Angstroms in thickness. The source and drain contacts 58 and 60 may be suitably masked during this latter deposition step to prevent Al deposition thereon, and it will be observed that, at this point in the prosess, the source, gate, and drain electrodes are shorted together. However, this problem may be overcome by using an etch out technique to be subsequently described.

The structure in FIG. 2*c* is then transferred to a proton acceleration chamber wherein its upper surface is bombarded with 150 KeV protons at a dose on the order of 5.5 × $10^{12}/cm^2$. These protons penetrate through the aluminum gate metalization 62 and the underlying $SiO_2$ layer 54 to enter the epitaxial layer 52 and thus form a defect compensated high resistivity $N^-$ region 64 as shown. This region 64 is perfectly aligned with the interior edges of the source and drain electrodes 48 and 50 and extends continuously therebetween. The carrier concentration in the $N^-$ channel region 64 is reduced from about $10^{18}$/cc to about $10^{15}$/cc during the above proton bombardment process, and thid device will be turned off at $V_{GS} = 0$ for a given $V_{DS}$.

At this point in the process, the aluminum gate metalization 46 will still be shorted to the source and drain electrodes 48 and 50 and appropriate electrical isolation steps must be employed in order to etch out the peripheral regions 66 of the gate metalization layer 62. This step will electrically isolate the gate terminal G in FIG. 2d from the source and drain contacts S and D as shown. If, however, the MOSFET device is to be used as current limiter, where the gate electrode is connected to one of the source and drain electrodes, then etching will be necessary only on one side of the gate metallization layer 64.

Hydrochloric acid (HCl) may be utilized to preferentially attack the exposed peripheral portions 66 of the gate metallization 62 when the latter is appropriately masked with a photoresist (not shown) covering all but the peripheral regions 68 of this metalization. Ideally, and for purposes of maximum transconductance, $G_m$, it is preferred that the peripheral edges 60 of the gate metallization extend as close as possible to the source and drain electrodes 58 and 60.

Figure 2D:
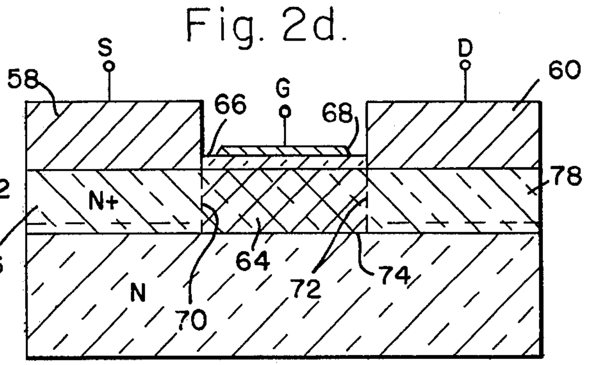

Alternatively, there are other acceptable methods for removing the gate metallization from the regions 66 as shown in FIG. 2*d* and thus prevent shorting the gate electrode 62 to the source and drain electrodes 58 and 60. These devices may be tilted during the application of HCl to keep the HCl away from the central region of the gate electrode. Or, still another technique for solving this problem of electrical shorting of the source and drain electrodes to the gate electrode 62 would be to deposit a thin layer of $SiO_2$ over the entire surface of the structure before depositing the layer of gate metallization 62 thereon. This layer of $SiO_2$ would physically separate the source and drain electrodes from the gate electrode.

The dotted lines 70 and 72 in FIG. 2d indicate that the $N^+$ source and drain regions need not extend all the way to the epitaxial layer-substrate interface 74. This may be accomplished, for example, either by using a diffusion or ion implantation process to form a continuous $N^+$ layer which does not reach through to the interface 74. Alternatively, this may be accomplished by merely introducing dopant atoms in the epitaxial growth process near the completion thereof, so that only the regions of the epitaxial layer 42 remote from the interface 74 are of $N^+$ conductivity.

Obviously, there are many variations that may be introduced into the process shown in FIGS. 1 and 2 above without departing from the spirit and scope of this invention. For example, the photolithographic masking and etching techniques utilized in the fabrication of the MOS device in FIG. 2*d* may be modified so that the gate electrode layer 62 extends into perfect alignment with the inner periphery of the $N^+$ source and drain regions 76 and 78. In this case, the source and drain electrodes 58 and 60 must be moved laterally away from the $N^-$ FET channel region 64 and this may be accomplished by appropriately masking the epitaxial structure shown in FIG. 2*b* prior to forming the source and drain contacts 58 and 60 and prior to the proton implantaion step.

Referring now to FIG. 3, the non inverting digital logic circuit shown therein illustrates the substantial utility of the present invention. This is a typical computer circuit application in which a depletion mode Schottky gate field effect transistor 80 is directly cascaded to an enhancement mode Schottky gate field effect transistor 82. The input FET 80 is connected through a load resistor 84 to a $B^+$ power supply terminal 86 and the output FET 82 is connected via a load resistor 88 to the B+ power supply terminal 86. The source electrodes of the two FETS 80 and 82 are grounded as shown, whereas the drain electrode 90 of the FET 80 is connected to the gate electrode 92 of the output FET 82.

The depletion mode FET 80 is normally conducting when connected as shown across the B+ power supply, whereas the enhancement mode FET 92 is normally non-conducting, with its drain electrode 94 at approximately the B+ power supply potential. When a negative going logic pulse 96 is applied as shown to the gate electrode of the input FET 80, the FET 80 is driven to cutoff, thereby driving its drain electrode 90 up to the B+ power supply potential. This voltage swing at the gate electrode 92 of FET 82 provides the necessary channel enhancement for the enhancement mode FET 82 and thereby turns the FET 82 on. This produces a negative going logic swing at the drain electrode 94 of FET 82, so that the computer circuit shown in FIG. 3 is a non-inverting logic circuit with the output pulse 98 tracking the input pulse 96. When the input pulse 96 swings back to a zero logic level as shown, the output pulse 98 likewise swings back to a zero logic level as FET 80 again becomes conducting and FET 82 again becomes non conducting.

What is claimed is:

1. A process for fabricating an enhancement mode Schottky-barrier gate field effect transistor comprising the steps of:

a. forming source, gate and drain electrodes on a channel layer of a field effect transistor (FET) structure, with said gate electrode permitting protons to pass therethrough, and b. bombarding said gate electrodes and said channel layer with protons of predetermined energy and dosage, whereby said source and drain electrodes mask out protons from entering said field effect transistor structure, while said protons penetrate through said gate electrode and the exposed portion of said channel layer to thereby lower the conductivity of said channel layer by a predetermined amount and establish a cutoff condition for a zero gate voltage and a given source-to-drain voltage applied to said field effect transistor.

2. The process defined in claim 1 which includes bombarding said FET structure with a proton dosage on the order of $5.5 \times 10^{12}$ protons per square centimeter and with an acceleration voltage of approximately 150 KeV.

3. The process defined in claim 1 wherein said source and drain electrodes are deposited on said channel layer to a thickness on the order of 3000 to 5000 Angstroms and said gate electrode is deposited on said channel layer to a thickness on the order of 1100 Angstroms or less.

4. The process defined in claim 1 wherein said FET channel layer is treated by initially implanting dopant ions therein to increase the carrier concentration therein to approximately $10^{18}$ carriers per cubic centimeter, and by thereafter bombarding said layer between said source and drain electrodes with protons to controllably decrease the carrier concentration therein to approximately $10^{15}$ carriers per cubic centimeters.

5. The process defined in claim 1 wherein said source and drain electrodes are comprised of atoms at least five times heavier than the atoms of said gate electrode.

6. The process defined in claim 5 wherein said source and drain electrodes are a gold-germanium alloy and said gate electrode is aluminum.

7. A process for fabricating an enhancement mode metal-oxide-semiconductor (MOS) field effect transistor which comprises the steps of:

a. forming an FET channel layer on the surface of a semiconductor substrate, b. forming source, gate, and drain electrodes atop the surface of said FET channel layer, with said gate electrode being separated from said channel layer by a thin layer of insulating material, said layer of insulating material and said gate electrode either being substantially thinner than the corresponding individual layer thicknesses of said source and drain electrodes or being comprised of substantially lighter atoms than those of the source and drain electrodes, or both, c. bombarding said source, drain and gate electrodes and their supporting structure with protons of sufficiently high energy and dosage to penetrate through both said gate electrode and said insulating layer thereunder to enter the FET channel layer and raise the resistivity thereof by a predetermined amount sufficient to produce enhancement mode action in said field effect transistor; and d. electrically isolating at least one edge of said gate electrode from said source and drain electrodes.

8. A process for forming an enhancement mode field effect transistor (FET) which comprises the steps of:

a. forming an FET channel layer on a semiconductor substrate, b. depositing source, gate and drain electrodes atop said channel layer, with said gate electrode being sufficiently thin or light in atomic weight to permit the passage of protons of a predetermined energy and dosage therethrough and said source and drain electrodes being sufficiently thick or heavy in atomic weight to prevent said protons from passing therethrough; and c. bombarding said gate electrode and underlying and adjacent FET channel layer with said protons, whereby said protons enter said channel layer and raise the resistivity of said FET channel layer to a level sufficient to render it non-conducting for a zero applied gate voltage and a fixed source-to-drain voltage.

9. The process defined in claim 8 wherein said gate electrode is deposited directly on said FET channel layer to thereby form a Schottky gate transistor.

10. The process defined in claim 8 wherein a thin insulating layer is formed between said gate electrode and said FET channel layer, and said protons penetrate through both said insulating layer and said gate electrode in the fabrication of an MOS type device.

11. The process defined in claim 9 wherein said source and drain electrodes are a gold germanium alloy and said gate electrode is aluminum.

12. The process defined in claim 10 wherein said source and drain electrodes are a gold germanium alloy and said gate electrode is aluminum.

* * * * *